United States Patent [19]

Cowell

[11] Patent Number: 5,860,134
[45] Date of Patent: *Jan. 12, 1999

[54] MEMORY SYSTEM WITH MEMORY PRESENCE AND TYPE DETECTION USING MULTIPLEXED MEMORY LINE FUNCTION

[75] Inventor: Thomas Michael Cowell, Poughkeepsie, N.Y.

[73] Assignee: International Business Machines Corporation, Armonk, N.Y.

[ * ] Notice: The term of this patent shall not extend beyond the expiration date of Pat. No. 5,715,207.

[21] Appl. No.: 623,352

[22] Filed: Mar. 28, 1996

[51] Int. Cl.[6] .............................. G06F 13/00; G11C 7/00
[52] U.S. Cl. ........................ 711/172; 711/170; 711/115; 711/5; 365/189.03; 365/230.03; 365/230.02
[58] Field of Search .................................. 395/442, 405, 395/497.01, 497.03; 365/189.03, 230.03, 230.02; 711/115, 5, 170, 172

[56] References Cited

U.S. PATENT DOCUMENTS

| | | | |
|---|---|---|---|
| 3,815,103 | 6/1974 | Holtey et al. | 395/183.18 |
| 4,030,080 | 6/1977 | Burkett et al. | 711/115 |
| 4,215,397 | 7/1980 | Hom | 364/136 |
| 4,485,437 | 11/1984 | Kinghorn | 395/185.06 |
| 4,575,714 | 3/1986 | P. W. Rummel | 340/568 |
| 4,654,787 | 3/1987 | Finnell et al. | 711/172 |
| 4,701,878 | 10/1987 | Gunkel et al. | 395/282 |
| 4,787,060 | 11/1988 | Boudreau et al. | 711/172 |
| 4,860,252 | 8/1989 | Sykora | 711/5 |
| 4,899,272 | 2/1990 | Fung et al. | 365/230.03 |
| 4,926,314 | 5/1990 | Dhuey | 711/172 |
| 4,980,850 | 12/1990 | Morgan | 711/172 |
| 5,040,153 | 8/1991 | Fung et al. | 365/230.03 |
| 5,164,916 | 11/1992 | Wu et al. | 365/52 |
| 5,241,663 | 8/1993 | Rohwer | 711/172 |
| 5,253,357 | 10/1993 | Allen et al. | 711/115 |
| 5,446,860 | 8/1995 | Dresser et al. | 711/100 |
| 5,524,232 | 6/1996 | Hajeer | 711/115 |
| 5,539,912 | 7/1996 | Clarke, Jr. | 711/115 |

OTHER PUBLICATIONS

T. T Dang et al., "Memory Presence Circuit for a Processor Complex", IBM Technical Disclosure Bulletin, vol. 36, No. 10, Oct. 1993, pp. 325–326.

*Primary Examiner*—Glenn Gossage
*Attorney, Agent, or Firm*—Marc A. Ehrlich

[57] ABSTRACT

A method and apparatus for enabling the detection of memory presence and identification of memory type in a memory system are disclosed. A memory controller may be connected to a memory bank inserted into a memory bank insertion area, via an interconnect line such as row address strobe (RAS) signal line commonly used to activate or deactivate the memory banks. Presence detect signals are multiplexed over the interconnect line for detecting whether a memory bank is connected to a given line. For connected memory banks, type detection operations may be performed on the interconnect line for detecting the type of memory bank connected thereto. The presence and type detection operations generate output signals to permit the dynamic configuration of a memory system controller. Accordingly, it is possible to implement memory systems capable of accommodating differing quantities and types of memory banks with a single controller utilizing a single interconnect line to enable presence detection and type identification to enable the appropriate configuration thereof. In an embodiment utilizing a select line as the interconnect line, implementation of the presence and type detection is accomplished without the addition of dedicated detect lines to the memory system.

5 Claims, 11 Drawing Sheets

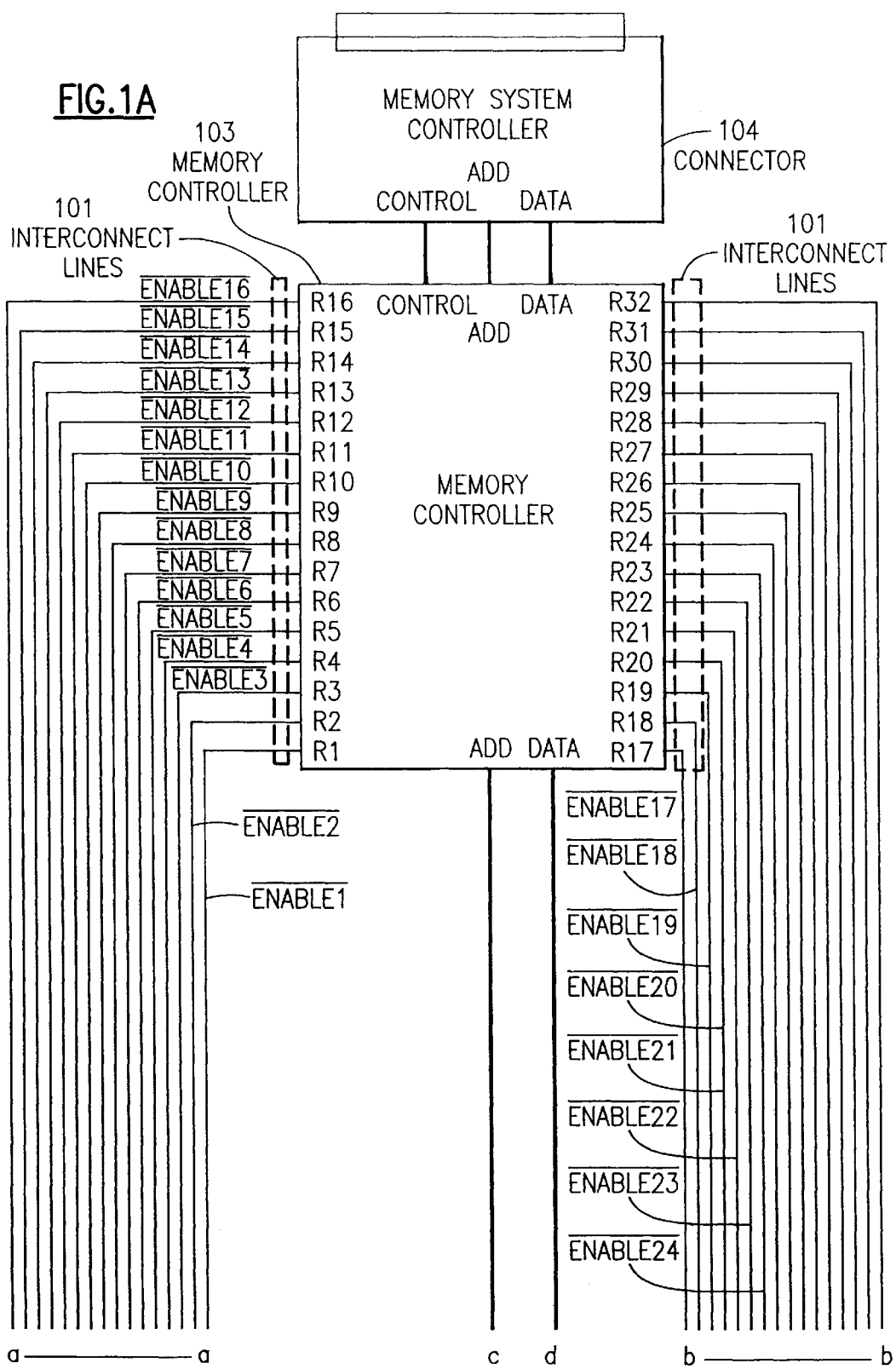

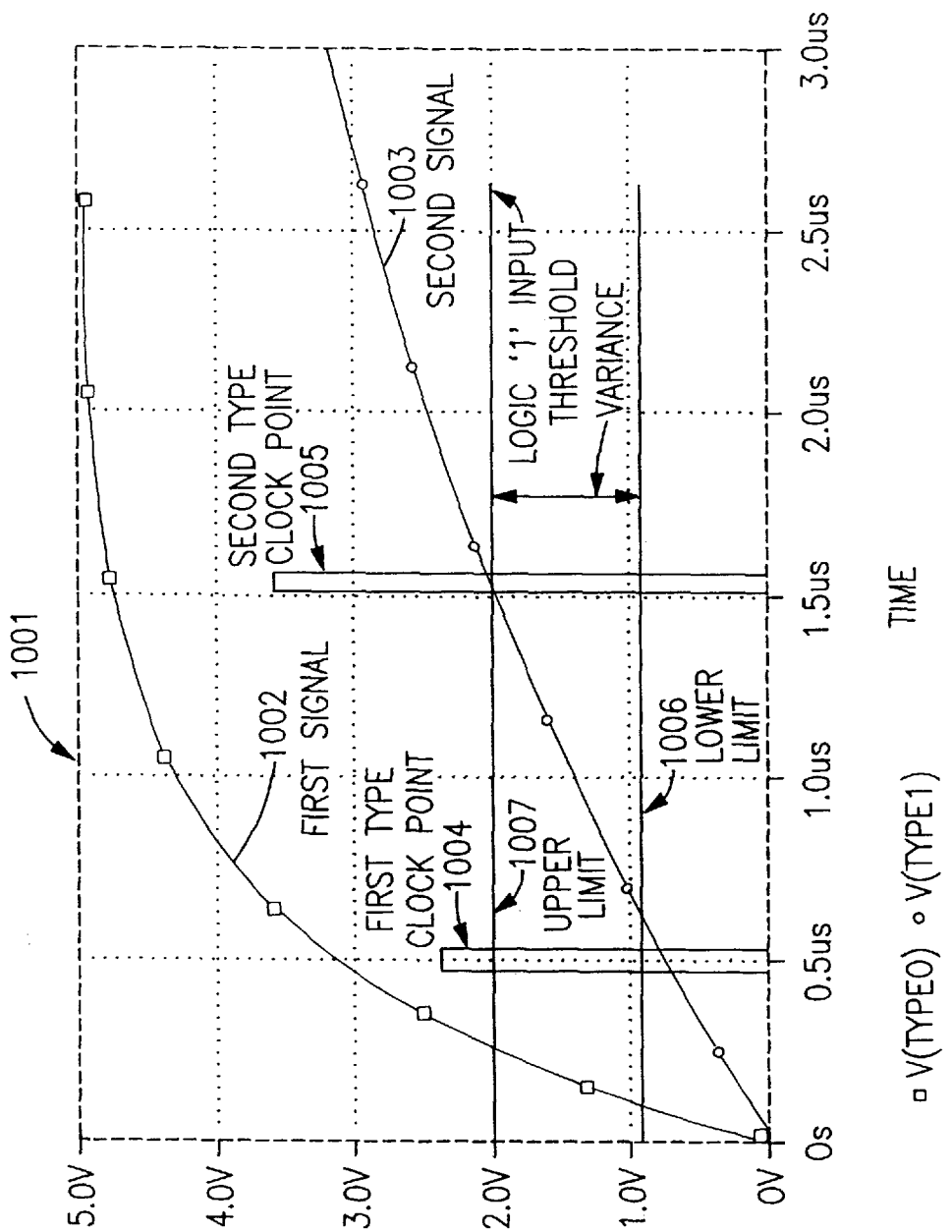
FIG. 10 WAVEFORM DIAGRAM FOR PROPER READBACK CLOCKING POINTS

MEMORY SYSTEM WITH MEMORY PRESENCE AND TYPE DETECTION USING MULTIPLEXED MEMORY LINE FUNCTION

CROSS REFERENCE TO RELATED APPLICATION

This application for Letters Patent is related and cross reference may be had to U.S. patent application Ser. No. 08/623,209 entitled "Memory Presence and Type Detection Using Multiplexed Memory Line Function", by Thomas M. Cowell, filed concurrently herewith, now U.S. Pat. No. 5,715,207.

FIELD OF THE INVENTION

The present invention relates to the field of memory system design, and particularly to the design of memory systems capable of accommodating variations in the amount and types of memory devices included therein.

BACKGROUND OF THE INVENTION

In modern memory system design a controller is typically utilized to control a number of memory banks, each of which may accommodate a multiplicity of memory components. In order to function as an interface between the memory and another system which may seek access to the memory for the storage or retrieval of data, the controller must be configured to control the particular amount and types of memory banks comprising a particular memory system. Memory bank types may differ, for example, by the speed grades of the memory components accommodated thereby or by the architecture of the particular memory bank. A particular memory bank may, for example, utilize eight memory components with four data ports creating a memory bank with thirty two data bits, while another type of memory bank may offer additional data bits for parity error checking by including a ninth memory component in the memory bank architecture. A further type of memory bank may include ten memory components in the memory bank architecture enabling the system to utilize the additional data bits for encoding error correcting check bits.

When designing such memory systems it is desirable to utilize a single common memory controller that is capable of functioning in a memory system in which the number of memory banks may be altered. Additionally, it is further desirable to utilize a single common memory controller that will function with a number of different types of memory banks. A memory system design capable of detecting and accommodating these variations in memory quantity and type would enable the design and manufacture of memory systems with different quantities and types of memory banks, each designed to meet the requirements of a particular memory system application, without the need to match a specific memory controller with each of these memory systems. Moreover, a further advantage which may be derived from such a memory system is the ability for such a system to manage the real-time alteration of the quantity and/or types of memory within a particular memory system without necessitating the replacement of the controller.

Current memory systems accomplish memory presence and type detection via the addition of dedicated presence detection lines for presence detection operations and separate dedicated type detection lines for type detection operations. For example, U.S. Pat. No. 5,164,916 issued to Wu, et al. teaches a memory module sensing method wherein a dedicated presence detection line couples the sense resistors on inserted memory banks, thereby creating a total resistance equivalent to the parallel combination of the sense resistors on the inserted memory modules. An analog sensing scheme is used to convert the parallel resistance to a logic signal which is coupled via the presence detection line to a comparator for sensing the number of memory modules present. As a further example, U.S. Pat. No. 4,787,060 issued to Boudreau, et al. teaches a method for presence and type detection of a memory module, wherein a first signal on a dedicated presence detection line indicates module presence in a first state, and no module presence in a second state. A second signal on a dedicated type detection line indicates the detection of a first type of memory in a first state or a second type of memory in a second state.

These prior art teachings require that as many as two extra dedicated detection lines per memory module (one for presence and one for type detection) be added to the memory system. In a complex memory system including thirty two memory banks, these systems would require the addition of up to sixty four wires. In such a high density memory system space is typically at a premium. The addition of these extra wires may necessitate the use of finer wiring technologies than the wiring technologies that are ordinarily used for memory system assembly, thereby augmenting the complexity and cost of the memory system. Furthermore, the patent to Wu, et al. requires that a comparator be added to the memory system. This additional component is not typically needed in memory system design and further adds to the cost and complexity of the memory system.

Another recent memory system design utilizes identification registers which are selected over the system address bus. The memory system described in U.S. Pat. No. 4,485,437 issued to Kinghorn teaches that a data processing unit may sense the presence of random access memory units (hereinafter "RAMs") on a memory bank by accessing multi-bit identification codes stored in memory registers on each memory bank. These identification codes are accessed via the system address bus, and read over the system data bus. The data processing unit interprets these codes to sense the presence of each memory bank. This design requires that registers are included on each memory bank to enable readout for presence detection which adds to the complexity of the memory system and increases the cost of the memory banks.

U.S. Pat. No. 4,926,314 issued to Dhuey, et al. teaches the use of an algorithm implemented by the system CPU to determine the system memory capacity formed via the insertion of a number of memory modules. Under control of the algorithm the CPU writes data to unique memory locations on the inserted memory modules and subsequently reads the data back looking for either incorrect or repeating values. In this manner the CPU determines the memory capacity of the system, however, the algorithm occupies CPU resources, thereby delaying the execution of other system routines. Moreover, this algorithm would require a significant amount of run time to sense memory presence in higher density memory systems.

SUMMARY OF THE INVENTION

The foregoing problems and the shortcomings of the prior art are overcome and additional advantages are provided by the detection of the presence and type of memory banks in a memory system by multiplexing a presence detection function and type detection function over a single memory interconnect line.

A presence detect signal is generated by a controller including presence detect circuitry, on a memory interconnect line. The memory interconnect line connects the controller to an area that may accommodate the insertion of memory banks so that the controller would be coupled by the memory interconnect line to a memory bank input when a memory bank is inserted into the insertion area. The presence detect signal is modified in accordance with the presence or absence of a memory bank in the insertion area. The modified presence detect signal is read by the presence detector to enable the determination of the presence or absence of a memory bank connected to the controller over the particular memory interconnect line.

For memory banks connected to the controller, an additional feature of the invention enables the detection of the type of each connected memory bank via type detection circuitry included in the controller. A type detection signal is generated by the controller, over the memory interconnect line connecting the controller to the memory bank input. The type detection signal permits the identification of a connected memory bank as one of any number of memory bank types which may be connected to the controller in a given memory system.

With the information provided by the presence and type detection operations of the present invention, the controller may be configured via configuration signals from the presence and type detection circuitry to control the particular combination of memories for a particular memory system application.

The invention provides a means for determining the quantity and types of memory banks in a memory system wherein presence and type detect signals are multiplexed over a memory interconnect line. In a preferred embodiment, the memory interconnect line may be a memory select line such as a row address strobe (RAS) line, which may subsequently provide activate and deactivate signals from the controller to a detected memory bank at the memory bank enable node. The detection scheme of the present invention enables the determination of the memory configuration of a memory system which can accommodate varying numbers of memory banks, each accepting at least one memory component, and wherein the memory types associated with each memory bank may be different. With this invention a simple, flexible and cost-efficient means for determining the quantity of memory and types of memory comprising a given memory system is taught.

BRIEF DESCRIPTION OF THE DRAWINGS

The subject matter which is regarded as the invention is particularly pointed out and distinctly claimed in the claims at the conclusion of the specification. The foregoing and other features and advantages of the invention will be apparent from the following detailed description taken in conjunction with the accompanying drawings in which:

FIG. 1A and FIG. 1B depict a block diagram of an example of the present memory system including a memory controller connected to a memory bank insertion area by memory interconnect lines on an interconnection medium;

FIG. 10 illustrates a waveform diagram for proper read back clocking points to compensate for memory controller port receiver input switching threshold variance.

DETAILED DESCRIPTION OF THE PREFERRED EMBODIMENTS OF THE INVENTION

In accordance with the principles of the present invention, a method and apparatus for determining the configuration of a memory system which can accommodate a varying number of memory banks of different types is taught. In order to ascertain the memory configuration for a particular memory system the present invention includes circuitry for determining the number of memory banks present in the system, and for determining, for each memory bank detected by the circuitry, the type of memory bank that has been detected. With this detection and identification scheme the memory controller device which controls the utilization of the memory banks can be configured to control a particular memory configuration for a particular memory system. In a preferred embodiment of the invention the interaction between the memory controller and a particular memory bank is facilitated by the inclusion of a resistor coupled to a memory bank enable node.

Figure 1B:
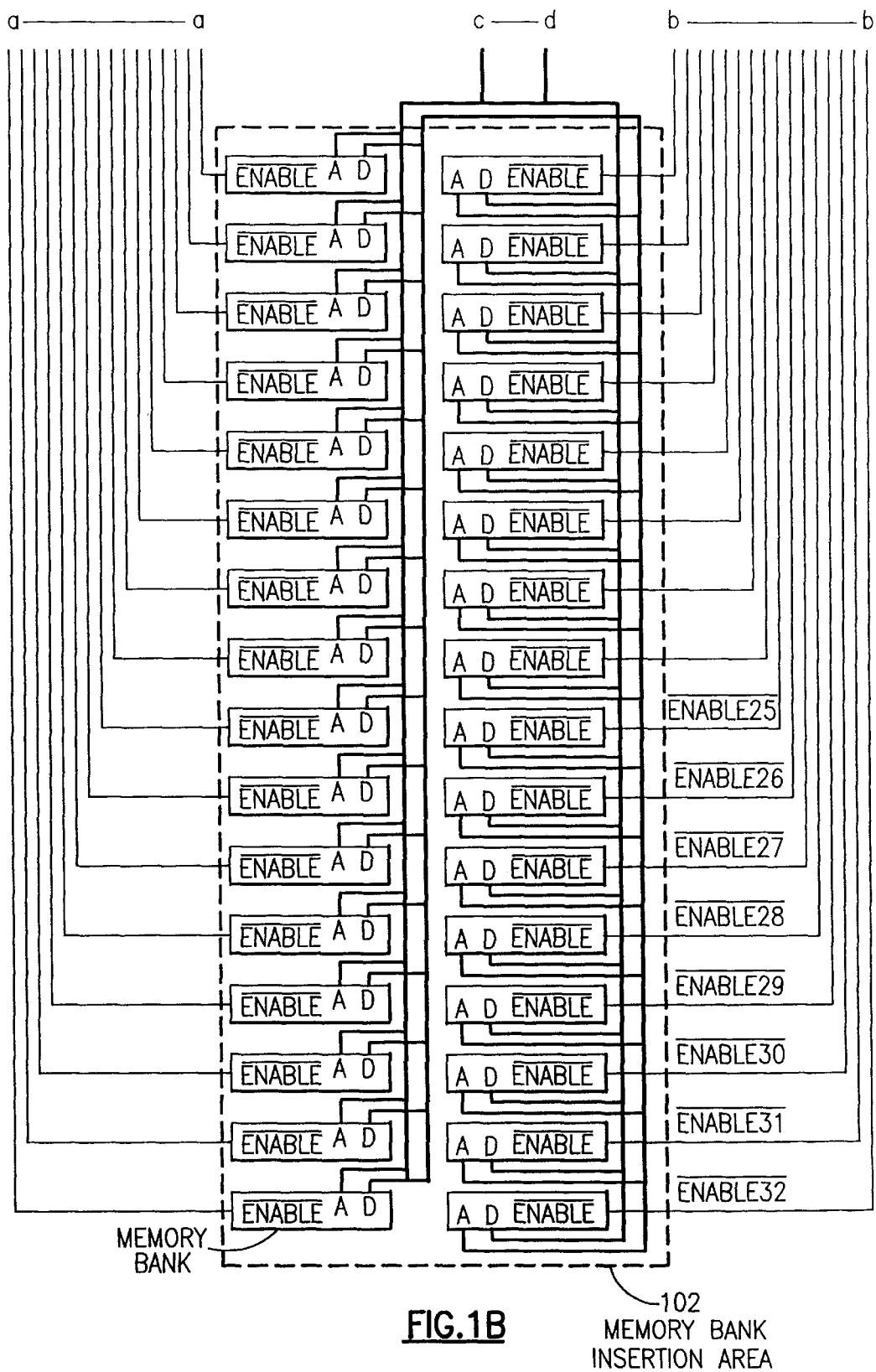

Turning now to our invention in greater detail, reference may be had to FIG. 1A and FIG. 1B which may be read as a single contiguous illustration connecting at points a,b,c, and d. FIG. 1A and 1B depict an overview of an embodiment of a memory system generally designed in accordance with the principles of the present invention. The memory system includes an interconnect medium which in a preferred embodiment would include conductive wiring (101) patterned on an insulating substrate, commonly referred to as a printed circuit board, an area that is designated for the insertion and population of memory banks (102), a memory controller (103) which may be of a type typically utilized in memory system design, and a connector (104) such as an industry standard ninety six pin DIN connector for coupling the memory system to another system such as a data processing unit. The conductive wiring (101) in the interconnect medium serves to couple the memory controller (103) to the memory bank insertion area (102).

Figure 2A:
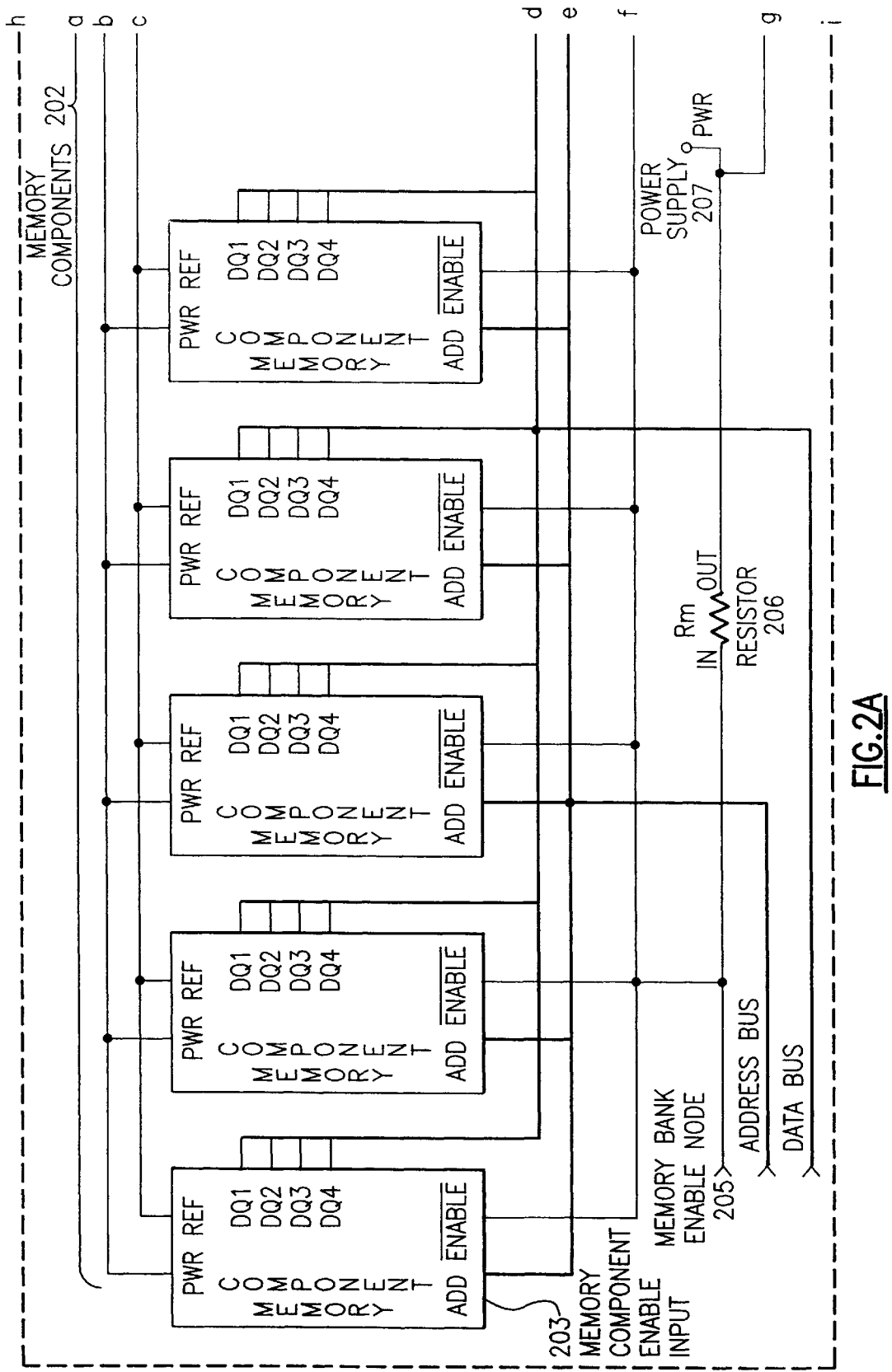
FIG. 2A and FIG. 2B depict a block diagram of an exemplary memory bank of the present memory system.
Figure 2B:
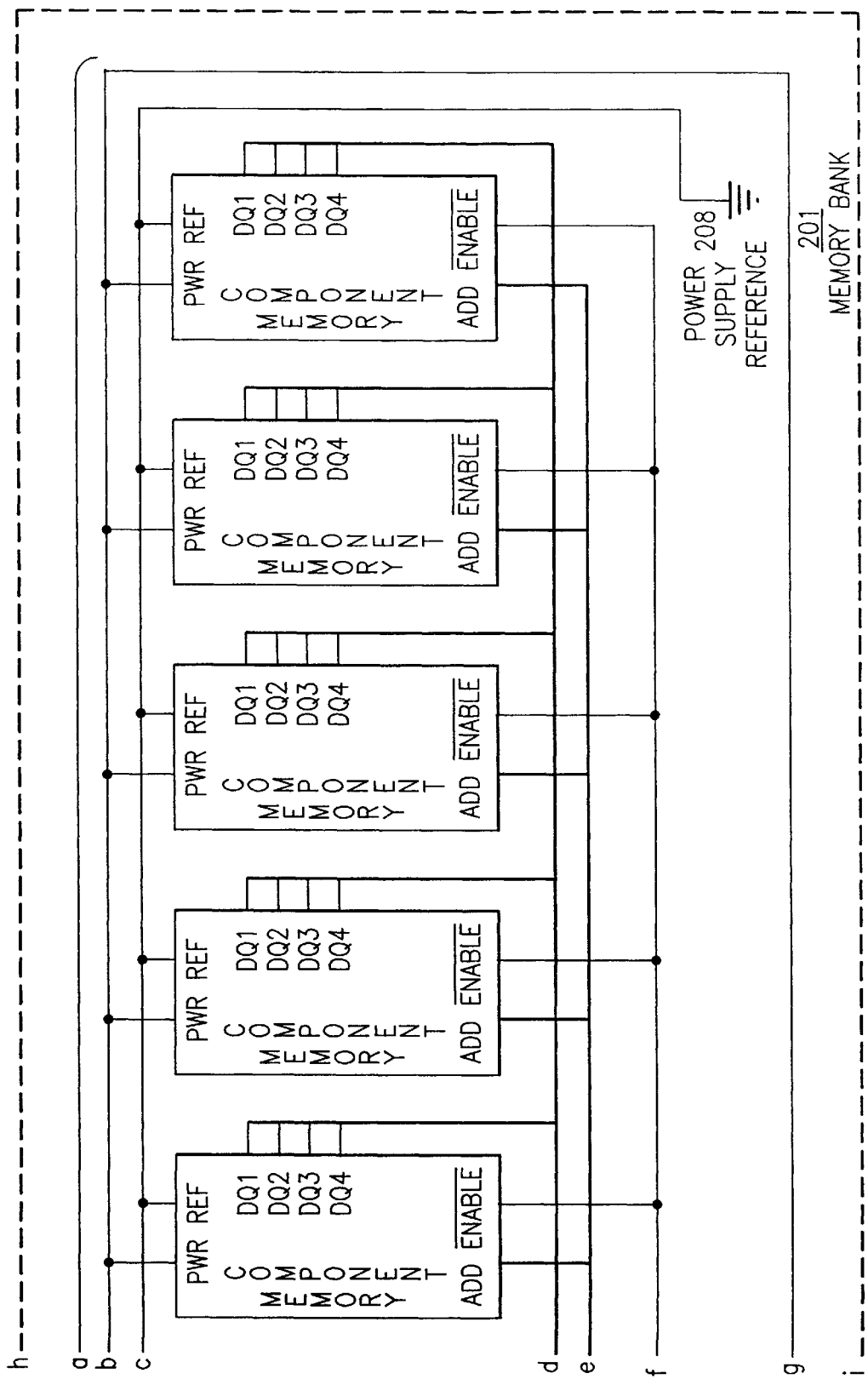

FIG. 2A and FIG. 2B which may be read as a single contiguous illustration connecting at points a, b, c, d, e, f, g, h and i, illustrate a block diagram for a preferred embodiment of a memory bank for use in the present invention. The memory bank (201) includes at least one memory component (202), including a memory component input which in a preferred embodiment would be a memory component enable input (203). Each of the memory component enable inputs (203) shares a common memory bank node on the memory bank (201) which in a preferred embodiment including the memory component enable inputs (203) would be a memory bank enable node (205). In a preferred embodiment these memory banks may be substantially similar to a personal computer single in-line memory module (SIMM) or other memory banks having a common enable pin, that are well known to those of ordinary skill in the art. The memory bank enable node (205) is coupled to the memory controller (103) over the conductive wiring (101) (not shown in FIGS. 2A–2B) enabling the memory controller (103) to activate or deactivate the memory components (202) so as to enable and disable the data transfer process associated with the memory bank (201). In another embodiment of the invention, a dedicated detection line or any other single memory line connecting the controller (103) to the memory bank enable node (205) which in turn connects to enable inputs (203) on each of the memory components (202) on the memory bank (201) may be utilized. For ease of illustration, the features of the present invention will be described by reference to an embodiment in which a select line (101) between the memory controller and the memory bank enable node (205) is utilized to implement the presence and type detection features.

For illustrative purposes, the memory components (202) included on the memory bank (201) will be described as ten dynamic random access memory (hereinafter "DRAM") components (202), however it will be apparent to one of ordinary skill in the art that different quantities and other types of memory such as static random access memory (SRAM) components may be utilized in a like manner. These ten DRAM components (202) share the common memory bank enable node (205), which in one embodiment may be an active low node. When presented with a logic zero voltage level this node (205), through connections to the memory component enable inputs (203), activates the DRAM components (202) enabling the memory bank (201) to participate in data transfer operations.

In an embodiment of the invention featuring DRAM components (202) the memory bank enable node (205) may be the row address strobe (hereinafter "RAS") node and the memory component enable inputs (203) for the ten DRAM components (202) may be RAS inputs. Likewise, the interconnect medium in this embodiment would include a separate RAS line in lines enable (101) for connecting the memory controller (103) to the RAS (memory bank enable) node (205) of each memory bank (201) inserted into the memory bank insertion area (102). In this embodiment, a resistor (206) which enables the detection of memory bank presence and memory bank type is coupled between the RAS memory bank enable node (205) and the memory bank positive power supply (207).

Figure 3:
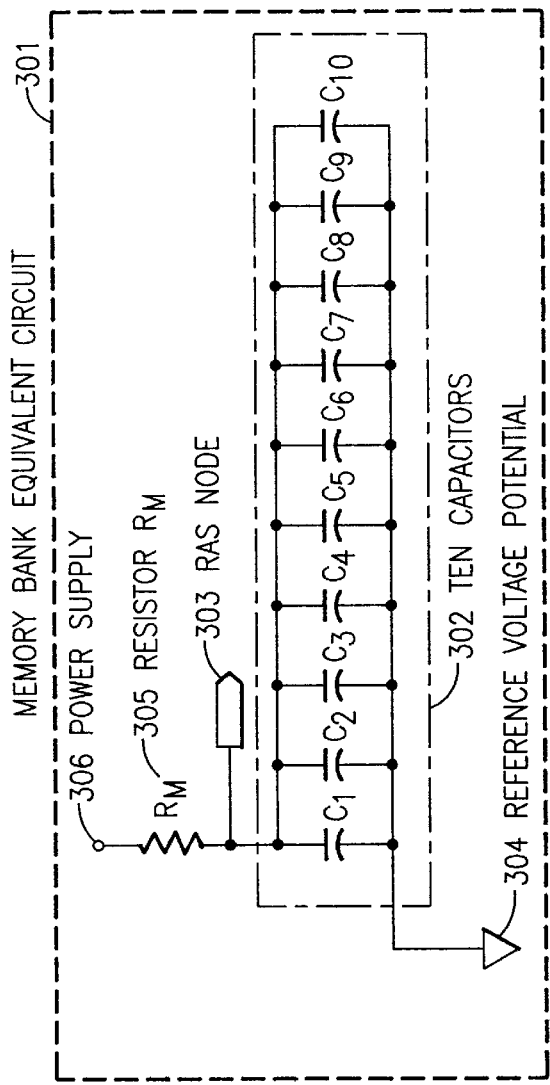
FIG. 3 depicts an equivalent circuit representing the electrical characteristics of an exemplary memory bank which are significant for presence and type detection.

As shown in FIG. 3 an equivalent circuit (301) may be drafted to represent the electrical characteristics of the illustrated embodiment of a memory bank (201). Memory components in common use in memory system design typically exhibit a capacitance between a memory component input pin and the memory component power supply, and between the input pin and the memory component power supply reference potential. This capacitance is inherent in memory component fabrication and packaging technology. Manufacturers commonly provide component specifications which include a typical range for this capacitance as measured at the memory component inputs, such as the RAS input (203). In a preferred embodiment wherein the memory bank includes ten DRAM circuits typical RAS input capacitance for industry standard DRAM components is nominally between 4 to 7 picofarads (pF). For example, in a sixteen megabit DRAM component, available from International Business Machines (hereinafter IBM) Corporation as part number IBM0117400-60, (specifications published in IBM Corporation 1995 DRAM Memory data book on page 142, incorporated herein by reference) a maximum capacitance of 7 picofarads is specified between the RAS input (203) and the memory component ground reference connection or between the RAS input and the memory component power supply connection. Since the RAS node (205) is common to the ten DRAMs, each exhibiting this capacitance, FIG. 3 depicts a circuit wherein ten capacitors (302) are connected in parallel between the RAS node (303) and the memory bank power supply reference potential (304). The resistor (305) is shown connected between the RAS node (303) and the positive power supply (306).

Figure 4:
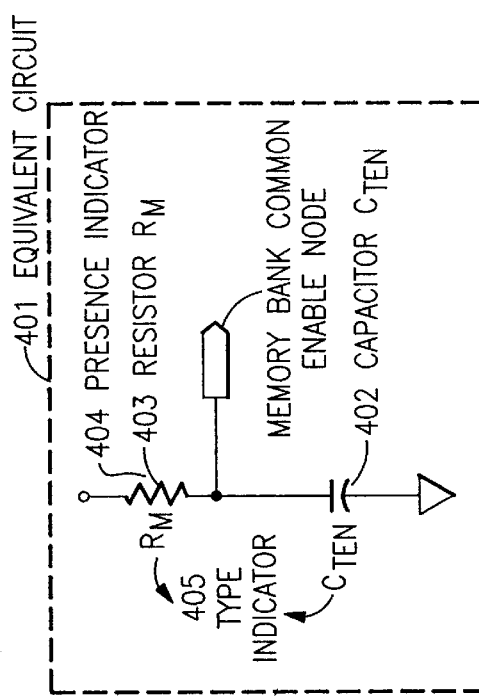
FIG. 4 depicts a simplified equivalent circuit for the circuit shown in FIG. 3.

Referring now to FIG. 4, a simplified equivalent circuit (401) for the circuit represented in FIG. 3 is illustrated. The ten capacitors connected in parallel form a total capacitance equivalent to the sum of the ten capacitors. The capacitor (402) in this simplified equivalent circuit possesses a capacitance value (hereinafter $C_{ten}$) equivalent to the sum of the ten capacitors (302) shown in FIG. 3. The resistor (403) hereinafter referred to as $R_m$ is the resistor which enables the detection of memory bank presence and, in conjunction with the capacitor $C_{ten}$, enables the identification of memory bank type. Thus, the resistor $R_m$ (403) represents the presence indicator (404) for the memory bank (201) and the resistor $R_m$ (403) together with the capacitor $C_{ten}$ (402) represent the type indicator (405) for the memory bank 201. It should be noted here that the resistance value $R_m$ will vary for different memory bank types. The determination of the values of $R_m$ that may be distinguished by the present invention will be addressed subsequently.

Figure 5:
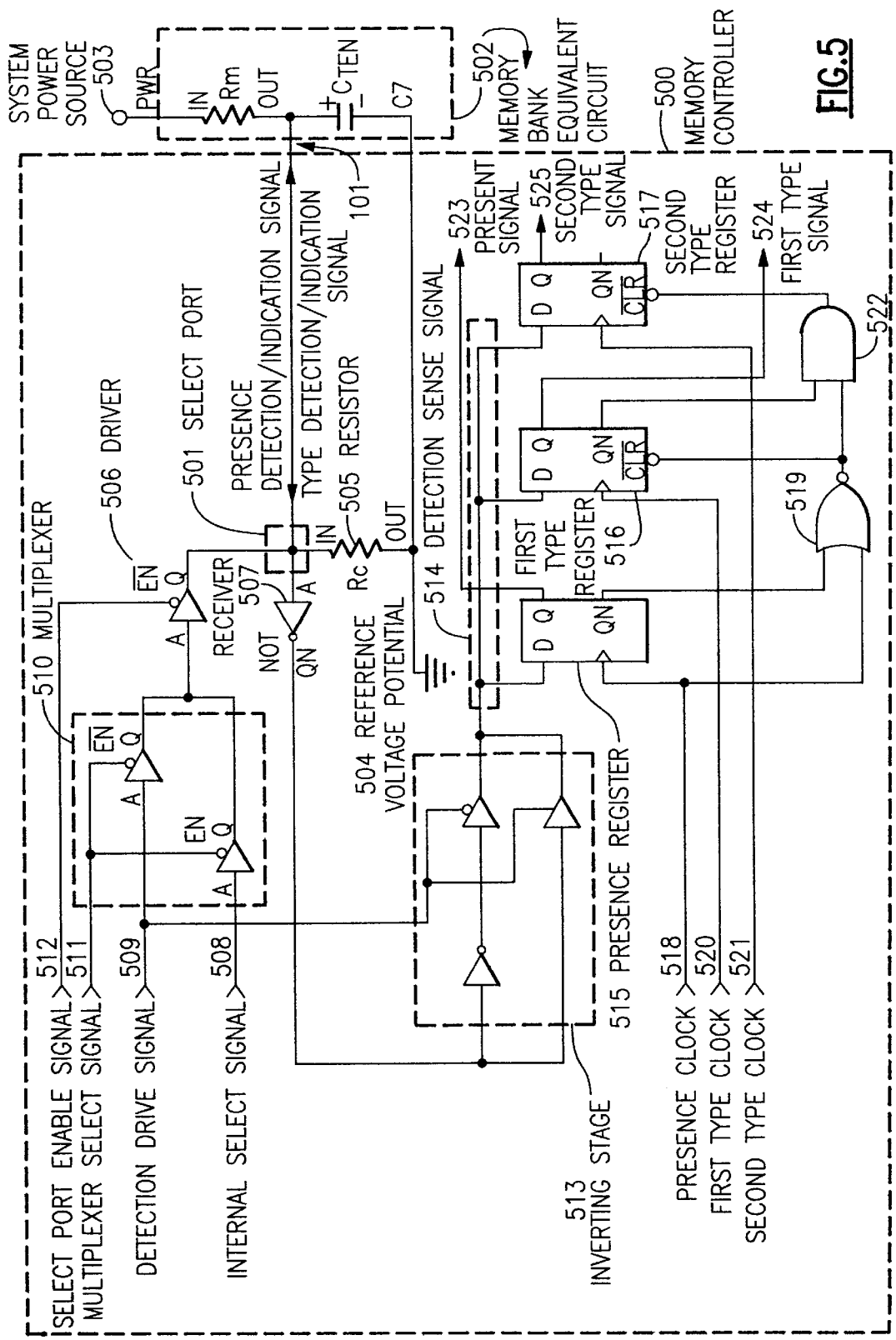
FIG. 5 depicts the simplified equivalent circuit for the exemplary memory bank connected to an exemplary memory controller.

FIG. 5 illustrates presence and type detect circuitry (500) for the memory controller (103). In particular, the memory controller select port (501) which is coupled via the conductive wiring (101) to the memory bank (201) is shown. In the preferred embodiment including the ten DRAM components the controller select port would be a bidirectional RAS port (501) and a separate RAS port (501) included in the memory controller (103) would connect via a separate RAS line (101) to each of the memory banks (201) populating the memory bank insertion area (102). This select port (501) is shown coupled to the memory bank (201) as represented by simplified equivalent circuit (502) for the memory bank depicted in FIG. 4. For illustrative purposes, FIG. 5 depicts the connection between a single memory controller select port (501) and a single memory bank (502), however it is contemplated by the present invention that identical circuitry would exist for each memory bank present in a particular memory system associated with the memory controller (103) incorporating the features of the present invention.

The simplified memory bank circuit (502) and the memory controller are both connected to the system power source (503) and the system reference voltage potential (504).

The memory controller (103), through the select port (501) is connected via an enable line, which in a preferred embodiment is a RAS line, to the memory bank enable node (205) (depicted in FIG. 2A). A resistor (505) within the memory controller (103) is connected between the memory controller select port (501) and the system reference voltage potential (504). The resistor (505) possesses a resistance value which will hereinafter be referred to as $R_c$. Many industry standard memory controllers commonly employed in memory system design, utilize device technology capable of producing the effective resistance value $R_c$, however, a resistor externally connected to the memory controller (103) may be incorporated in accordance with the illustrated circuitry to achieve identical results as would a controller capable of producing the resistance value $R_c$ of the illustrated resistor (505). The select port (501) is a bidirectional select port which includes a driver (506) and a receiver (507). The receiver circuit (507) of the present invention will incorporate the characteristics of hysteresis, such that a separation between the switching thresholds of logic one and logic zero enables the sampling of an input signal which changes slowly over time. Receivers possessing such hysteresis characteristics are common design elements well known to those skilled in the art of memory system design.

The source for select port driver (506) may be designated as either the internal select signal (508) or the detection drive signal (509). In the preferred embodiment incorporating the ten DRAM components the internal select signal (508) would be the RAS signal. A multiplexer (510) receives a multiplexer select signal (511) which determines whether the memory bank select port (501) will generate a memory bank select signal (508) (a RAS signal in a preferred embodiment) or a memory bank detection drive signal (509). Regardless of which source is selected, the select port output is enabled by a select port enable signal (512). Following the receiver (507) an inverting stage (513) may be incorporated for inverting the output signal of the receiver, depending upon the logic state of a detection drive signal (509) received by the memory controller select port (501).

The output of the inverting stage (513) presents a detection sense signal (514) which is in turn presented to the data inputs of three registers (515, 516 and 517). The first register (515) stores the state of the detection sense signal (514) upon the positive edge of the presence clock signal (518). A logic one stored in the first register (515) indicates the detection of a memory bank (502) whereas the storage therein of a logic zero indicates that there is no memory bank present. The NOR gate (519) clears the second (516) and third registers (517), which function to detect memory type, when the presence clock signal (518) transitions to a logic state of one, concurrent with the first register's (515) storage of a logic signal indicating memory bank presence or absence. Upon the storage of a logic zero in the first register (515) indicating the absence of memory bank (502) in the memory system, the NOR gate (519) prevents memory type detection by the second (516) and third (517) registers.

The second register (516) stores the state of the detection sense signal (514) upon the occurrence of a positive edge of a first type clock signal (520). The storage of a logic one in the second register (516) indicates that a first type memory was detected. The third register (517) stores the state of the detection sense signal (514) upon the occurrence of a positive edge of a second type clock signal (521). The storage of a logic one in the third register (517) indicates that a second type memory was detected. An AND gate (522) prevents the third register (517) from indicating the detection of a second type memory when the second register (516) indicates that a first type memory was detected.

Figure 6:
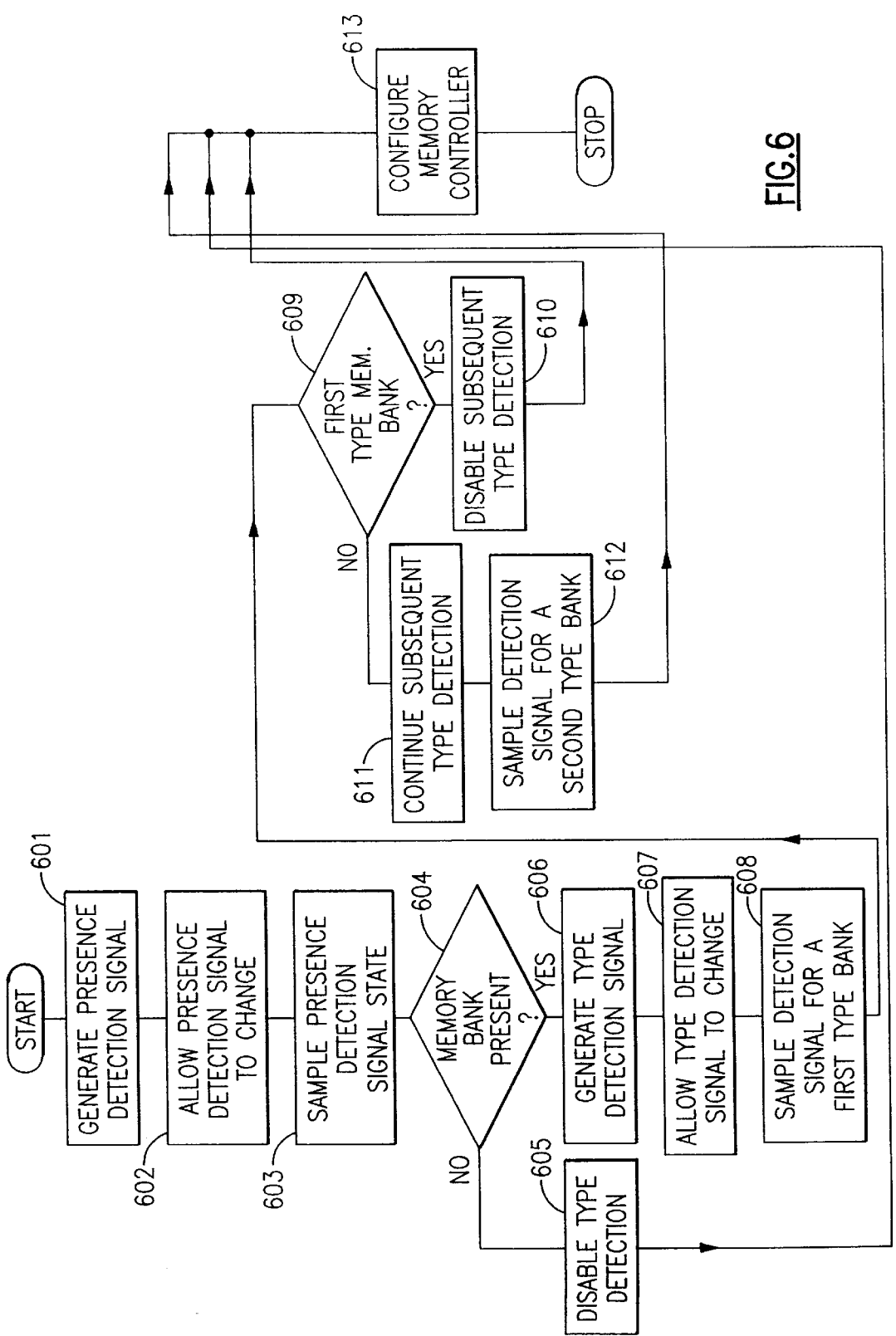
FIG. 6 depicts a flow diagram for the presence and type detection operations of the present invention.

The operation of the memory controller (103) in conjunction with each of the memory banks (201) included in a particular memory system designed in accordance with the principles of the present invention may be understood via reference to the flow diagram of FIG. 6. For illustrative purposes the flow diagram illustrates the detection and identification operations in a system including two types of memory banks, however it will be understood that the same principles described herein would permit detection of any number of memory bank types included in a particular memory system.

In a memory system design incorporating both the presence detection and type detection features of the present invention, the operation of the system would logically begin with the presence detection function. Presence detection is initiated by setting the select port (501) to function as an input port via the memory controller select port enable signal (512). The presence detection signal is generated (601) by the memory controller as a result of the voltage bias created by the memory controller resistor $R_c$. The presence detection signal is then allowed to change (602) based upon the presence or absence of the resistance from the memory bank resistor (402) $R_m$ representing the presence indicator (404) for the memory bank 201 corresponding to the presence or absence of a memory bank. The memory bank resistor (403) sets a logical one voltage level at the memory controller select port (501) when the memory bank is present in the insertion area. If the memory bank (502) is not present in the insertion area, the resistance value associated with $R_c$ is low enough to cause the voltage level at the memory controller select port (501) to be logic zero.

Once the presence detect signal has been allowed to change at the memory controller select port (501) according to the presence or absence of the memory bank, the logical state at the memory controller select port is sampled as detection sense signal (514) and stored in the first register (515) used for memory bank presence detection (603). The positive edge of the presence clock signal (518) latches the logical state at the memory controller select port (501) to the first register (515) thereby registering the memory presence indication in the first register (515).

The fourth step (604) entails the determination of whether a memory bank (201) was detected. If no memory bank is detected, the NOR gate (519) prevents the second (516) and third registers (517) from storing the memory bank type, and thus the type detection operation is disabled (605). Conversely, where the presence of a memory bank is identified by the first register (515), the memory controller initiates the type detection operation, by forcing and thereafter sensing a type detection signal (606) on the select port (501). The type detection signal is established over the same interconnect line as is used with the presence detection signal (as shown by the bidirectional multiplexed signals over the line (101) interconnecting the memory controller (500) and the memory bank (502) in FIG. 5). The process by which the type detection signal is forced and then sensed is as follows: The type detection signal is first forced by presenting the detection drive signal (509) as a logic zero output signal from the memory controller select port (501) through multiplexer (510), by toggling the port enable signal (512) to a logic zero state. The logic zero state at the select port (501) provides a current path for the memory bank capacitor (402) which enables the charge associated with the memory bank capacitor having capacitance $C_{ten}$ to be discharged.

Once the memory bank capacitance has been discharged, the memory controller select port (501) is reconfigured to function as a receiver by toggling the port enable signal (512) to a logic one state provided to the select port driver (506), and the state of the type detection signal is allowed to change as the memory bank capacitor voltage level rises (607). The resistance $R_m$ associated with the memory bank resistor (403) charges the discharged memory bank capacitor, and the associated voltage rise is coupled over the interconnect line (101) to the receiver stage (507) of the memory controller select port (501).

Subsequently, sampling (608) and storage of the logic state at the memory controller select port (501) occurs at a point in time at which it would be expected the resistance value $R_m$ for a memory bank resistor (403) for a first type memory bank would produce a logic one state at the memory controller select port (501). At this predetermined point in time, the logical state at the memory controller select port is stored in the second register (516) upon the positive edge of the first type clock signal (520). A logic one stored in the second register (516) indicates that the detected memory bank has been identified as a first type memory bank, in step 609. Upon detection of a first type memory bank, the AND gate (522) disables the continued processing of the type detection operation associated with the third register (517) for identifying second type memory banks (610). If a logic zero has been stored in the second register (516) (NO in step 609), however, the memory type detection operation will continue (611).

In the final memory type identification step the logic state present at the memory controller select port (501) at a point in time at which it would be expected that a resistance value $R_m$ for a memory bank resistor (403) for a second type memory bank would produce a logic one at the memory controller select port (501) is sampled and stored (612). At this predetermined point in time the logical state of the memory controller select port (501) is stored in the third register (517) upon the occurrence of a positive edge of the second type clock signal (521). The storage of a logic one in the third register (517) indicates the detection of a second type memory bank. At the conclusion of presence and type detection operations, configuration signals (523, 524, and 525 described below) are provided to the controller to configure the memory controller (613) in accordance with the results of the detection and identification operations to control the memory banks of the particular memory system.

The operation of the memory controller in detecting memory bank presence and type may be further illustrated by reference to the waveform diagrams of FIGS. 7–9. The signals represented in these diagrams are, from FIG. 5, the port enable signal (512), presence clock signal (518), first type clock signal (520) and second type clock signal (521). These signals may be understood in conjunction with the schematic representation of the memory controller detection circuitry (500) depicted in FIG. 5. Likewise, the configuration signals generated by the memory controller detection circuitry of FIG. 5, specifically the present signal (523), first type signal (524), and second type signal (525), which are output from the detection circuitry (500) to other memory controller circuitry to set the configuration of the memory controller, may be understood via reference to the memory controller detection circuitry (500) shown in FIG. 5. Finally, the detection signal present at the select port (501), which is an external bidirectional signal containing encoded information of memory bank presence and type may be understood via reference to the memory controller detection circuit (500) of FIG. 5.

Figure 7:
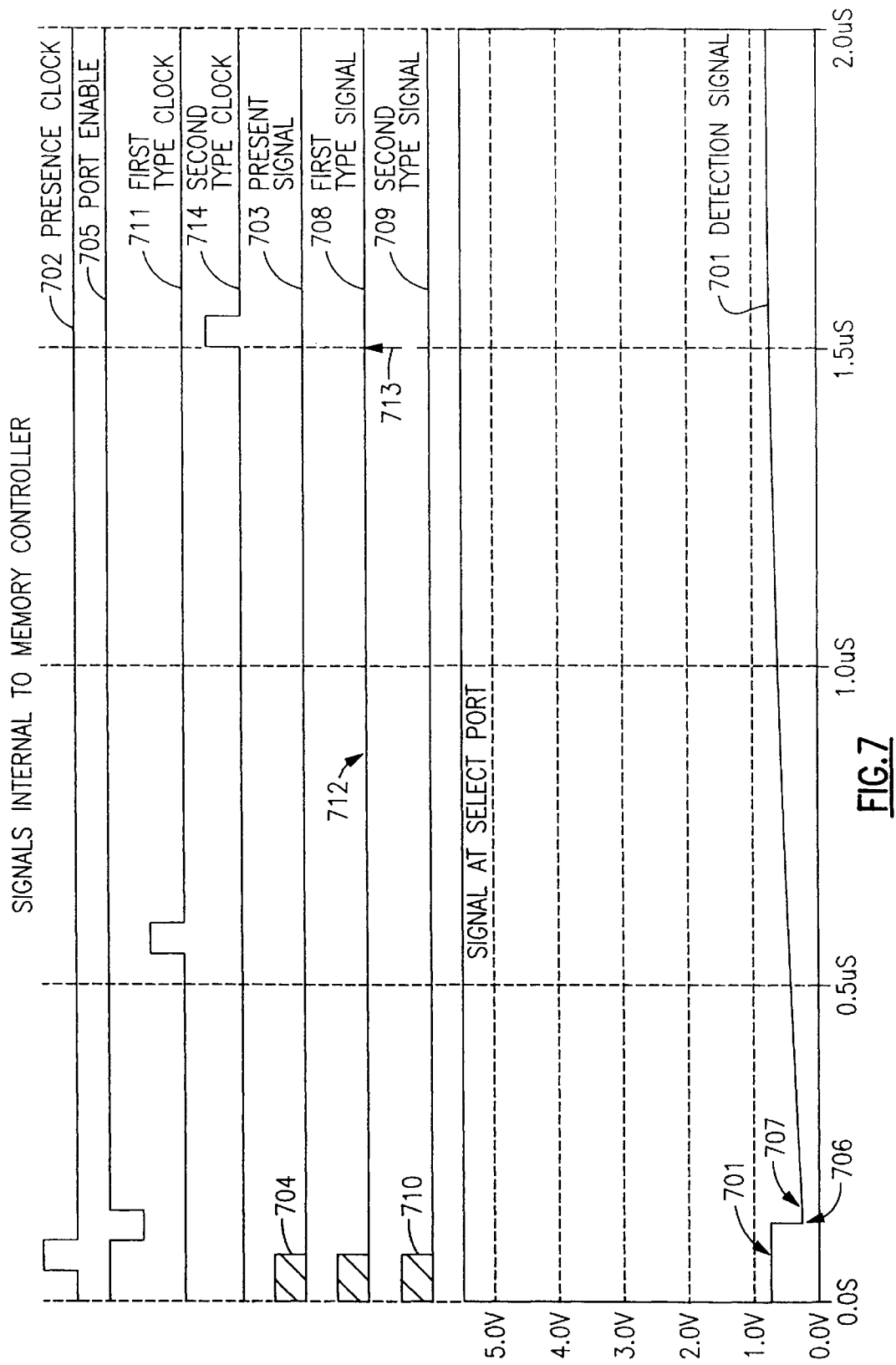
FIG. 7 illustrates a waveform diagram for a controller detection operation for detecting the presence or absence of a memory bank.

Referring now to FIG. 7, a waveform diagram depicting the detection operation of the memory controller (103) when no memory bank (201) is detected is shown. The presence detection signal is generated by the memory controller as a result of the voltage bias created by the memory controller resistor (505) having a resistance value of $R_c$. The presence detection signal is then allowed to change based upon the presence or absence of a memory bank in the insertion area. In the waveform diagram, since no memory bank is present, no memory bank resistor is present to counteract the voltage bias created by $R_c$, and the detection signal (701) is below a voltage level required to produce a logic one state at the memory controller select port (501). The positive edge of the presence clock signal (702), as previously described, causes the logic state of the detection signal (701) to be registered in the first register (515). Since the detection signal (701) is at a logic zero level, the present signal (703) remains at logic zero (704) indicating that no memory bank has been detected. Upon the zero transition of the presence clock signal (702), the port enable signal (705) transitions to a logic zero state thereby enabling the memory controller select port (501) to drive the detection signal (701) to approximately zero volts (706). The port enable signal (705) then returns to a logic one state at which point the voltage level of the detection signal (701) begins to rise (707). The logic states of the first type signal (708) and the second type signal (709) are both zero at the end of the presence detection operation (710), and are prevented from being registered (712, 713) to logical one states, by operation of the zero state on the present signal (703) in conjunction with the operation of the NOR gate (519) shown in FIG. 5.

Figure 8:
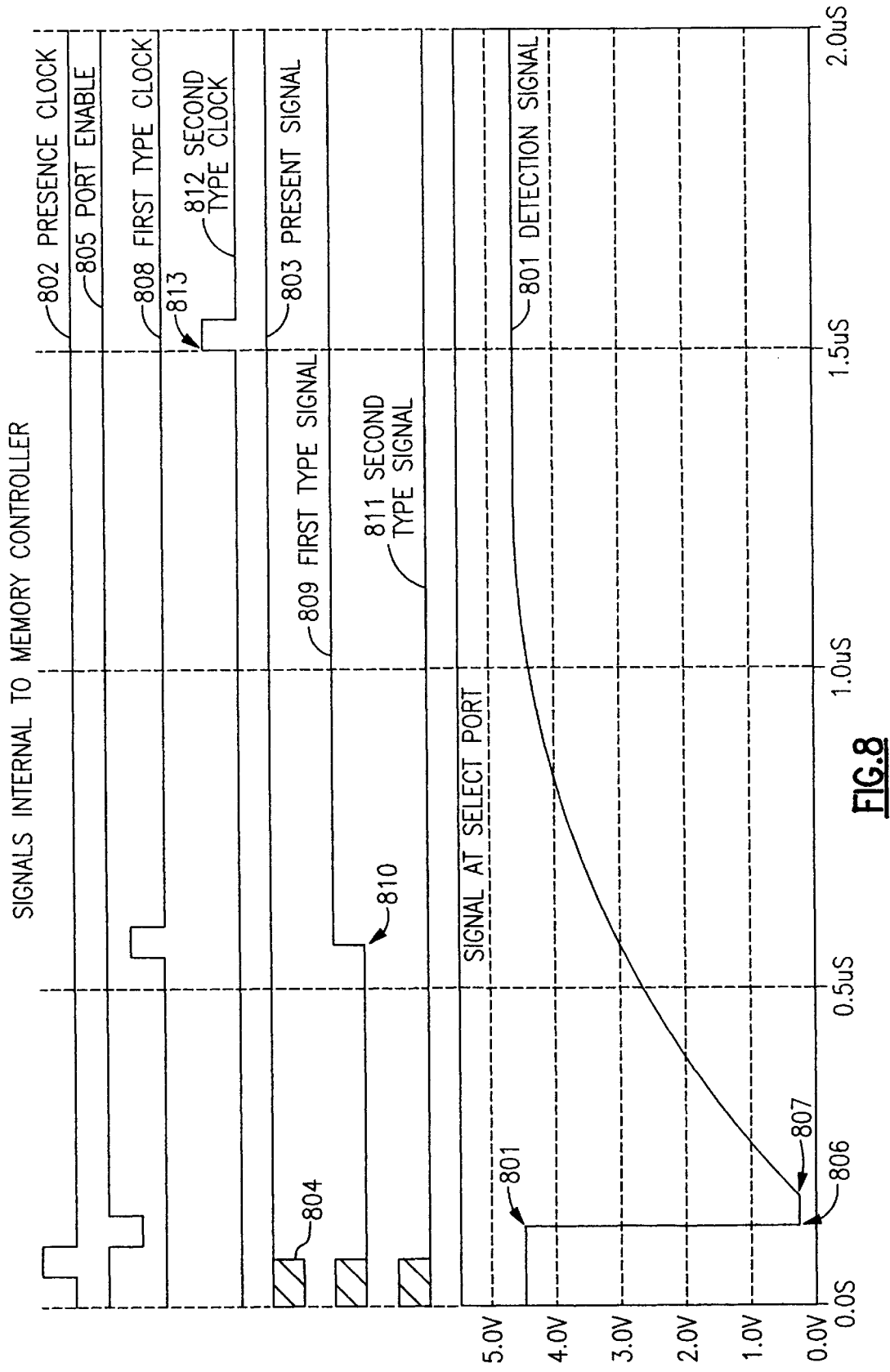
FIG. 8 illustrates a waveform diagram for a memory bank detection operation for detecting the presence and type of a memory bank when a first type memory bank is detected.

Referring now to FIG. 8, a waveform diagram depicting the detection operation of the memory controller (103) upon detection of a first type memory bank (201) is shown. The presence detection signal is generated by the memory controller as a result of the voltage bias created by the memory controller resistor (505) $R_c$. The presence detection signal is then allowed to change based upon the presence or absence of a memory bank in the insertion area. In this case, since a memory bank is present, the memory bank resistor (206) $R_m$, is present which counteracts the voltage bias created by $R_c$, and the detection signal (801) is at or above a voltage level that is required to produce a logic one state. The positive edge of the presence clock signal (802), as previously described, causes the logic state of the detection signal (801) to be registered in the first register (515), thereby causing the present signal (803) to toggle to a logic one state (804), indicating the presence of the detected memory bank (201). Upon the transition of the presence clock signal to a logic zero level (802), the port enable signal (805) transitions to a logic zero state which conditions the memory controller select port (501) as an output which in turn drives the type detection signal (801) (via the logic zero state of detection drive signal (509) presented as an output at the select port (501) over interconnection line 101. See FIG. 5 and accompanying description.), to approximately zero volts (806) thereby discharging the memory bank capacitor $C_{ten}$ (402). The port enable signal (805) then toggles to logic one state which conditions the memory controller select port (501) as an input. The voltage level of the detection signal begins to rise (807) as a result of the charging memory bank capacitor (402), in such a manner that it can achieve a logic one voltage level within a predetermined period prior to the positive transition of the first type clock signal (808). Following the positive transition of the first type clock signal (808), the first type signal (809) switches to a logic one voltage level (810) indicating to the controller that the detected memory bank is a first type memory bank. The toggling of the first type signal (809) to logic one (810) prevents the toggling of the second type signal (811) which remains at a logic zero voltage level when the second type clock signal (812) toggles to logic one (813).

Figure 9:
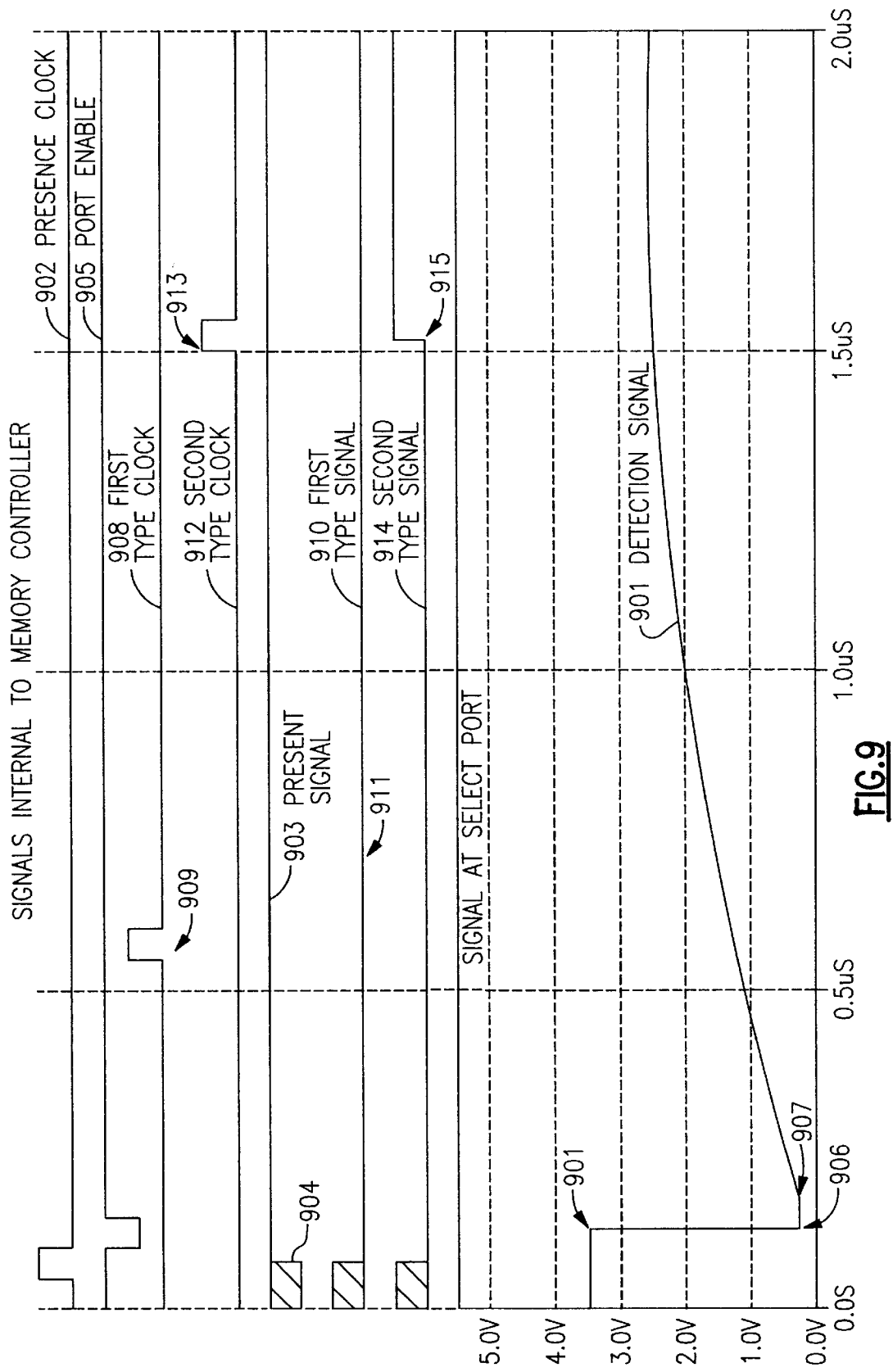
FIG. 9 illustrates a waveform diagram for a memory bank detection operation for detecting the presence and type of a memory bank when a second type memory bank is detected.

Referring now to FIG. 9, a waveform diagram depicting the detection operation of the memory controller (103) upon detection of a second type memory bank (201) is shown. The presence detection signal is generated by the memory controller as a result of the voltage bias created by the memory controller resistor (505) $R_c$. The presence detection signal is then allowed to change based upon the presence or absence of a memory bank in the insertion area. In this case, since a memory bank is present, the memory bank resistor (206) $R_m$ is present which counteracts the voltage bias created by the memory controller resistor $R_c$, and the detection signal (901) is at or above a voltage level that is required to produce a logic one state. The positive edge of the presence clock signal (902), as previously described, causes the logic state of the detection signal (901) to be registered in the first register (515), thereby causing the present signal (903) to toggle to a logic one state indicating the presence of the detected memory bank (201). Upon the transition of the presence clock signal to a logic zero level (902), the port enable signal (905) transitions to a logic zero state, enabling the memory controller select port (501) to drive the type detection signal (901) (via the logic zero state of detection drive signal (509) presented as an output at the select port (501) over interconnection line 101. See FIG. 5 and accompanying description.); to approximately zero volts (906) thereby discharging the memory bank capacitor $C_{ten}$ (402). The port enable signal (905) then toggles to a logic one, and the memory controller select port (501) is conditioned as an input. The voltage level of the detection signal begins to rise (907) as a result of the charging memory bank capacitor (402), in such a manner that it is unable to achieve a logic one voltage level within the predetermined time period for the first type memory, and accordingly the second register (516) does not store a logic one state when the first type clock (908) toggles to a logic one (909), and a logic one transition of the first type signal (910) does not occur (911). The voltage associated with the type detection signal continues to rise until it is at a voltage level indicating a logic one state before the second type clock signal (912) toggles to a logic one (913). Subsequently, the second type signal (914) switches to a logic one state (915) indicating to the controller that the memory bank detected is a second type memory bank.

The factors which govern proper selection of the memory controller resistor, $R_c$, and the memory bank resistor, $R_m$, will now be considered.

The resistance value $R_c$ is selected as a high resistance value so as to pull the voltage level of the memory controller select port (501) to logic zero state if a memory bank (201), including the resistor $R_m$, is not present. The value of $R_c$ is governed by the total input leakage current that exists at the memory controller select port (501). For typical complimentary metal oxide semiconductor (CMOS) circuits, input leakage is commonly less than or equal to ± one microamperes (±1uA). Thus, if the worst case leakage current value were to be modeled as a resistor, such a resistor would have a value of 5 megaohms (i.e. 5 volts/1uA). The leakage current could be to the system power supply (503) or to the system reference voltage potential (504), and accordingly, the voltage level of the memory controller select port and therefore its logic state can be pulled towards a logical one or logical zero voltage potential respectively. If the voltage level of the memory controller select port is pulled towards a logical zero state, the memory controller resistor (505) would not be required, however, if the voltage level of the memory controller select port is pulled towards a logical one state, which would normally signal the presence of a memory bank (201), a controller resistor (505), with a resistance value of $R_c$, would be needed to counteract the effect of the leakage current and to hold the memory controller select port to a logic state of zero. The voltage divider circuit set between the 5 megaohm resistor to the system power supply (503) and the memory controller resistor (505) with a resistance value of $R_c$ must present a logic zero voltage level at the controller. For CMOS circuits the logic zero voltage level is typically specified as less than or equal to 0.8 volts. Thus, the value of $R_c$ would be calculated by $(R_c = 0.8V * R_{LEAKAGE}/(5V-0.8V)$ equating to approximately 950 Kilohms.

The memory bank resistor (403) has a resistance value of $R_m$, which is calculated in the following manner: The first consideration is that the value of $R_m$ must be set to effectively signal memory bank presence. This consideration defines the highest value for $R_m$. The second consideration entails the determination of the lowest value of $R_m$, that can be utilized without effecting the switching characteristics of the enable node during the data transfer process. A value of $R_m$ is chosen between the aforementioned minimum and maximum values, which will indicate the memory bank type by setting the rate at which the memory bank enable node capacitance (402) $C_{ten}$ charges.

The maximum value of $R_m$ is determined as follows: To ensure that the determined value of $R_m$ effectively signals memory bank presence, the value of $R_m$ must be set to cause a logic one voltage level on the memory controller select port when the memory bank is present. In addition to counteracting the resistor (505) $R_c$, the value of $R_m$ must be low enough to offset the total leakage current which may flow from the memory bank enable node to the system reference voltage potential. This total leakage current would be the sum of the input leakage currents for all memory components on the memory bank plus the memory controller input leakage current. Typically, this total leakage current would be no more than (1uA×10 memory components)+ (1uA ×1 memory controller) or 11uA. This leakage current may be modeled as an effective resistance between the common enable node and the system reference voltage potential which would have a value of (5V/11uA) or 409 Kilohms. Thus, the highest value for $R_m$, that will counteract the value of $R_c$, and offset the leakage through the effective resistance of 409 Kilohms, so as to set the minimum logic one voltage level of 2.4V (a typical CMOS logic one threshold) is equal: to $((5V-2.4V)/2.4V) \times ((R_c \times R_{effective})/(R_c + R_{effective}))$ or 310 Kilohms.

The minimum value for $R_m$ is determined by assessing the point at which the signal switching integrity of the common enable node is effected by the value of $R_m$. While this point is a function of the select port driver strength and other factors specific to a particular memory system, a value not less than 10 Kilohms for $R_m$ will be applicable in most, if not all memory systems.

The determination of a value for $R_m$ which is between the determined minimum and maximum resistance values is determined in the following manner: After the total capacitance for the memory bank enable node (208) has been determined, the number of types of memory banks to be distinguished by the present invention is established. If differentiation between two different types of memory banks is required in the particular memory system design, the minimum value of $R_m$ can be chosen for the first type of memory bank and the maximum value of $R_m$ can be chosen for the second type of memory bank. The number of different types of memory banks that may be detected via a memory system comprising features of the present invention is a function of the variance of the logic one voltage threshold for the bidirectional memory controller select port receiver (505), and the variance of the total capacitance for the memory bank enable node. Since the points in time at which the memory controller samples the state of the interconnect line (101) at the select port (501) for a particular memory bank type are fixed and predetermined, and since these points in time are established so as to identify all memory bank types which may be manufactured for use in the memory system, the aforementioned variances must be considered.

The memory controller select port receiver (505) switching threshold will be specified by the component manufacturer as $V_{IH}$ and $V_{IL}$ in component specifications. The $V_{IH}$ specification, which is the logic one voltage threshold, refers to the voltage level that a signal must be greater than or equal to so as to ensure that the receiver input logic circuit will pass on a logic one to the controller circuitry coupled to the receiver. The $V_{IL}$ specification, which is the logic zero voltage threshold, refers to the voltage level which a signal must be less than or equal to so as to ensure that the receiver input logic circuit will pass on a logic zero to the controller circuitry coupled to the receiver. The $V_{IL}$ and $V_{IH}$ levels are manufacturer's specifications and the actual voltage level which will cause a particular receiver input to pass on a logic state will vary, but will not violate the component specification. By way of example, if the $V_{IH}$ level is considered, the receiver will be guaranteed to pass a logic one if its input is at a voltage greater than or equal to the specified value of $V_{IH}$. However, the receiver may pass on a logic one when the signal at its input is less than the specified level of $V_{IH}$. This actual logic one voltage level, while being less than the $V_{IH}$ specification, is known to be greater than the specified $V_{IL}$ level, however, because voltage levels equal to or less than the $V_{IL}$ specification are guaranteed by the manufacturer's specification to pass on a logic zero. When multiple components of the same design and technology are considered, the actual logic one voltage level of each will vary, however, each component will have a logic one voltage level less than that of the $V_{IH}$ specification. Therefore, a variance in the logic one voltage threshold is inherent. The broadest range of this variance can be defined by values less than or equal to $V_{IH}$ and greater than $V_{IL}$, but in practical applications the observed variance range will be considerably narrower. In order to illustrate how the number of different types of memory banks which may be detected varies as a function of the variance of the logic one voltage threshold, the broadest range of this variance will be considered. It will be understood however, that a narrower variance will allow a greater number of types of memory banks to be detected.

Referring now to FIG. 10., a graphical illustration (1001) depicts the voltage level at the memory controller select port (501) as a function of time for two signals. A first signal (1002) shows the rate at which memory bank enable node total capacitance is charged for a first type of memory bank, and a second signal (1003) shows the rate at which a memory bank enable node total capacitance is charged for a second type of memory bank. A first block (1004) represents the predetermined point in time at which the voltage level at the memory controller select port (501) would be a logic one voltage level if a first type of memory bank were present, and if a type other than the first type were present, the voltage level on the select port at this time would be a logic zero voltage level. This predetermined point in time will be referred to as the first type clock point (1004). A lower limit (1006) indicates the lowest voltage at which a particular memory controller receiver (505) may toggle to a logic one state, and an upper limit (1007) indicates the highest voltage at which a particular memory controller receiver (505) may toggle to a logic one state. The range between the upper limit (1007) and the lower limit (1006) is shown as the broadest possible voltage range extending between the $V_{IH}$ and $V_{IL}$ voltage specifications.

The first type clock point for sampling the state of the interconnect line (101) must occur late enough in time to ensure that the memory controller select port receiver (505) will pass on a logic one if and only if a first type memory bank is present in the insertion area (102). Two factors govern the latest point in time at which the first type clock point may be set. These two factors are the slowest charge rate for the enable node total capacitance for the first type memory bank, and the highest voltage level that the enable node is required to achieve before the select port receiver (505) will pass on a logic one. The variance in the enable node total capacitance is considered to determine the slowest charge rate for the enable node total capacitance. The highest value from the input pin capacitance range specified by the memory component manufacturer will produce the slowest charge rate for the enable node total capacitance. Since the memory bank resistor, $R_m$, will have approximately a five percent tolerance, the resistance variance of $R_m$ is not a significant factor in effecting the variance of the enable node total capacitance charge rate. The upper limit (1007) of the select port receiver (505) logic one switching threshold is considered to determine how high the voltage on the enable node capacitance must rise before the select port receiver (505) will pass on a logic one.

From the graph (1001) it may be observed that the first signal (1002) passes through the upper limit (1007) before the first type clock point (1004). The second signal (1003) must not be allowed to cause the select port receiver (505) to pass on a logic one at the first type clock point (1004), which would cause the system to incorrectly identify a second type memory bank as a first type memory bank. To preclude the possibility of this incorrect identification, the first type clock point must be set at an early enough point in time so that a second signal (1003), corresponding to a second type memory bank exhibiting a different enable node total capacitance rate of voltage change with respect to time, can not cause the select port receiver (505) to pass on a logic one at the first type clock point (1004).

Two factors govern the determination of how late in time the first type clock point (1004) may be set. These two factors are fastest rate at which the enable node total capacitance can charge for the second type memory bank, and the lowest voltage level on the enable node that will allow the select port receiver (505) to pass on a logic one. The variance in the enable node total capacitance is considered to determine the fastest charge rate. The lowest value in the memory component manufacturer's specified range for input pin capacitance will produce the fastest charge rate. The lower limit (1006) of the select port receiver (505) logic one switching threshold is considered to determine the lowest voltage level at the enable node that will permit the select port receiver (505) to pass on a logic one. Referring again to FIG. 10, it may be observed that the signal (1003) does not pass through the lower limit (1006) until after the first type clock point (1004). The factors considered in determining the second type clock point (1005) follow in the same manner as has been detailed for the determination of the first type clock point (1004). The objective for the second type clock point determination is to set the predetermined point in time so as to allow for all memory banks of the second type to be detected, and to prevent all other memory banks types from being detected at the second type clock point.

Though preferred embodiments have been depicted and described in detail herein, it will be apparent to those skilled in the relevant art both now and in the future, that various modifications, additions, improvements, and enhancements may be made without departing from the spirit of the invention and these are therefore considered to be within the scope of the invention as defined in the following claims. These claims should be construed to maintain the proper protection for the invention first disclosed.

What is claimed is:

1. A memory apparatus comprising:

a memory bank having a memory input node, said memory bank capable of being coupled to a memory controller via an interconnect line, said interconnect line coupling said memory controller to said memory bank input node on said memory bank, wherein said memory bank includes a presence indicator including a resistor coupled between said memory bank input node and a voltage reference, said presence indicator sending a presence indication over said interconnect line to said memory controller to indicate that said memory bank is connected thereto, said memory bank further including a type indicator including said resistor and a capacitance associated with said memory bank input node, said type indicator sending a type indication signal over said interconnect line to said memory controller to indicate the type of memory bank connected thereto, said type indication signal being generated based upon the values of said resistor and said capacitance, and wherein the value of the resistor is selected to generate a unique type indication signal corresponding to the type of the memory bank.

2. The memory apparatus according to claim 1 wherein said memory bank input node is a memory bank enable node.

3. The memory apparatus according to claim 2 wherein said memory bank is populated with one or more memory components and wherein each of said one or more memory components includes an enable input for coupling to said memory bank enable node on said memory bank.

4. The memory apparatus according to claim 3 wherein said memory bank enable node is a row address strobe (RAS) node and the interconnect line is a row address strobe (RAS) line.

5. The memory apparatus according to claim 4 wherein the enable input for each of said one or more memory components is a row address strobe (RAS) input.

* * * * *